United States Patent
Lohia et al.

(10) Patent No.: US 9,768,098 B2
(45) Date of Patent: Sep. 19, 2017

(54) PACKAGED SEMICONDUCTOR DEVICE HAVING STACKED ATTACHED CHIPS OVERHANGING THE ASSEMBLY PAD

(71) Applicant: Texas Instruments Incorporated, Dallas, TX (US)

(72) Inventors: Alok Kumar Lohia, Dallas, TX (US); Reynaldo Corpuz Javier, Plano, TX (US); Andy Quang Tran, Grand Prairie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/099,864

(22) Filed: Apr. 15, 2016

(65) Prior Publication Data

US 2016/0233147 A1    Aug. 11, 2016

Related U.S. Application Data

(62) Division of application No. 14/580,836, filed on Dec. 23, 2014, now abandoned.

(51) Int. Cl.
| | | |
|---|---|---|
| H01L 23/495 | (2006.01) | |
| H01L 21/78 | (2006.01) | |
| H01L 23/00 | (2006.01) | |
| H01L 25/00 | (2006.01) | |
| H01L 29/06 | (2006.01) | |

(Continued)

(52) U.S. Cl.
CPC ...... *H01L 23/4952* (2013.01); *H01L 21/4825* (2013.01); *H01L 21/565* (2013.01); *H01L 21/78* (2013.01); *H01L 23/3114* (2013.01); *H01L 23/49513* (2013.01); *H01L 23/49541* (2013.01); *H01L 23/49548* (2013.01); *H01L 23/49575* (2013.01); *H01L 24/85* (2013.01); *H01L 25/50* (2013.01); *H01L 29/0657* (2013.01); *H01L 23/3107* (2013.01);

(Continued)

(58) Field of Classification Search
CPC ......... H01L 24/42; H01L 24/44; H01L 24/47; H01L 2924/18165; H01L 24/85; H01L 23/528; H01L 2225/0651; H01L 2225/1052; H01L 2225/1076; H01L 2225/1088
USPC ................ 257/723, 730, 777, 787, 784, 786
See application file for complete search history.

(56) References Cited

U.S. PATENT DOCUMENTS 5,019,943 A * 5/1991 Fassbender ......... H01L 25/0657
                                                   257/777
5,804,004 A * 9/1998 Tuckerman ............. H01L 24/78
                                                   156/300

(Continued)

*Primary Examiner* — Earl Taylor
(74) *Attorney, Agent, or Firm* — Jacqueline J. Garner; Charles A. Brill; Frank D. Cimino

(57) ABSTRACT

A semiconductor device comprising a stack of semiconductor chips. The semiconductor chips have an electrically active side and an opposite electrically inactive side. The active sides bordered by an edge having first lengths and the inactive sides bordered by a parallel edge having a second lengths smaller than the first lengths. A substrate has an assembly pad bordered by a linear edge having a third length equal to or smaller than the first lengths. The inactive chip side attached to the pad so that the edge of the first lengths are parallel to the edge of the third length. The active side of the attached chip forms an overhang over the pad, when the third length is smaller than the first lengths.

8 Claims, 2 Drawing Sheets

(51) Int. Cl.
*H01L 21/48* (2006.01)
*H01L 21/56* (2006.01)
*H01L 23/31* (2006.01)

(52) U.S. Cl.
CPC .............. *H01L 2924/00014* (2013.01); *H01L 2924/10155* (2013.01); *H01L 2924/181* (2013.01)

(56) References Cited

U.S. PATENT DOCUMENTS

| | | | |
|---|---|---|---|
| 5,952,725 A * | 9/1999 | Ball | H01L 21/6836 257/686 |
| 6,342,730 B1 * | 1/2002 | Jung | H01L 21/4832 257/692 |
| 6,351,028 B1 * | 2/2002 | Akram | H01L 23/3185 257/686 |
| 6,730,544 B1 * | 5/2004 | Yang | H01L 23/3107 257/678 |
| 6,753,597 B1 * | 6/2004 | Crowley | H01L 23/49503 257/667 |
| 6,759,599 B2 * | 7/2004 | Tatoh | H01L 21/4846 174/255 |
| 6,759,745 B2 * | 7/2004 | Masumoto | H01L 21/6835 257/730 |
| 6,777,797 B2 * | 8/2004 | Egawa | H01L 23/3128 257/686 |
| 6,818,998 B2 * | 11/2004 | Kwon | H01L 23/3121 257/686 |
| 6,894,376 B1 * | 5/2005 | Mostafazadeh | H01L 23/3107 257/666 |
| 6,927,479 B2 * | 8/2005 | Ramakrishna | H01L 23/16 257/666 |
| 7,282,390 B2 * | 10/2007 | Tan | H01L 23/3128 257/724 |
| 7,344,969 B2 * | 3/2008 | Tan | H01L 23/3128 257/778 |
| 7,365,417 B2 * | 4/2008 | Camacho | H01L 23/3107 257/666 |
| 7,595,551 B2 * | 9/2009 | Ramakrishna | H01L 23/16 257/666 |
| 7,667,333 B2 * | 2/2010 | Singleton | H01L 25/0657 257/686 |
| 7,675,153 B2 * | 3/2010 | Kurosawa | H01L 21/6836 257/686 |
| 7,687,919 B2 * | 3/2010 | Park | H01L 25/0657 257/686 |
| 7,892,890 B2 * | 2/2011 | Kurosawa | H01L 21/6836 257/686 |
| 7,911,067 B2 * | 3/2011 | Camacho | H01L 21/568 257/783 |
| 8,143,102 B2 * | 3/2012 | Do | H01L 24/33 257/678 |
| 8,294,251 B2 * | 10/2012 | Takiar | H01L 24/83 257/686 |
| 8,304,918 B2 * | 11/2012 | Tsukano | H01L 23/3121 257/686 |
| 8,324,725 B2 * | 12/2012 | Khandros | H01L 23/13 257/668 |
| 8,344,487 B2 * | 1/2013 | Zhang | H01L 23/3107 257/669 |
| 8,368,188 B2 * | 2/2013 | Do | H01L 21/568 257/666 |
| 8,460,970 B1 * | 6/2013 | Sirinorakul | H01L 23/4951 257/E21.51 |
| 8,461,694 B1 * | 6/2013 | Sirinorakul | H01L 23/4951 257/777 |
| 8,470,640 B2 * | 6/2013 | Takiar | H01L 24/85 257/E21.499 |
| 9,171,790 B2 * | 10/2015 | Yu | H01L 25/50 |
| 9,214,452 B2 * | 12/2015 | Kim | H01L 25/0657 |
| 9,318,451 B2 * | 4/2016 | Pham | H01L 24/02 |
| 2002/0096754 A1 * | 7/2002 | Chen | H01L 24/33 257/686 |
| 2003/0006492 A1 * | 1/2003 | Ogasawara | H01L 21/561 257/684 |
| 2003/0025183 A1 * | 2/2003 | Thornton | H01L 23/49562 257/666 |
| 2003/0111720 A1 * | 6/2003 | Tan | H01L 25/0657 257/686 |
| 2004/0026768 A1 * | 2/2004 | Taar | H01L 21/78 257/686 |
| 2004/0222509 A1 * | 11/2004 | Ogata | H01L 24/29 257/686 |
| 2004/0262718 A1 * | 12/2004 | Ramakrishna | H01L 23/16 257/666 |
| 2005/0006746 A1 * | 1/2005 | Egawa | H01L 23/3128 257/686 |
| 2005/0056871 A1 * | 3/2005 | Taar | H01L 21/78 257/222 |
| 2005/0093174 A1 * | 5/2005 | Seng | H01L 24/83 257/782 |
| 2005/0236702 A1 * | 10/2005 | Ramakrishna | H01L 23/16 257/676 |
| 2006/0175697 A1 * | 8/2006 | Kurosawa | H01L 21/6836 257/686 |
| 2007/0158792 A1 * | 7/2007 | Camacho | H01L 23/3107 257/666 |
| 2007/0176275 A1 * | 8/2007 | Singleton | H01L 25/0657 257/686 |
| 2008/0251936 A1 * | 10/2008 | Kuroda | H01L 24/33 257/777 |
| 2008/0265432 A1 * | 10/2008 | O | H01L 23/562 257/777 |
| 2009/0072367 A1 * | 3/2009 | Poddar | H01L 24/32 257/676 |
| 2010/0059884 A1 * | 3/2010 | Kuan | H01L 21/6835 257/738 |
| 2011/0163458 A1 * | 7/2011 | Tsukano | H01L 23/3121 257/777 |
| 2011/0198752 A1 * | 8/2011 | Nondhasitthichai | H01L 21/4832 257/738 |
| 2011/0267789 A1 * | 11/2011 | Chew | H01L 21/4832 361/767 |
| 2011/0304015 A1 * | 12/2011 | Kim | H01L 23/552 257/532 |
| 2013/0001761 A1 * | 1/2013 | Rogren | H01L 24/97 257/676 |
| 2014/0021605 A1 * | 1/2014 | Yu | H01L 25/50 257/738 |
| 2015/0115474 A1 * | 4/2015 | Pham | H01L 24/02 257/777 |
| 2015/0181697 A1 * | 6/2015 | Goida | H01L 21/78 361/728 |
| 2015/0270229 A1 * | 9/2015 | Kang | H01L 25/0657 257/508 |
| 2015/0303175 A1 * | 10/2015 | Kim | H01L 25/0657 257/777 |
| 2016/0005679 A1 * | 1/2016 | Israel | H01L 24/96 257/368 |
| 2016/0050748 A1 * | 2/2016 | Usami | H01L 23/16 361/783 |
| 2016/0064360 A1 * | 3/2016 | Kim | H01L 25/0657 257/777 |

* cited by examiner

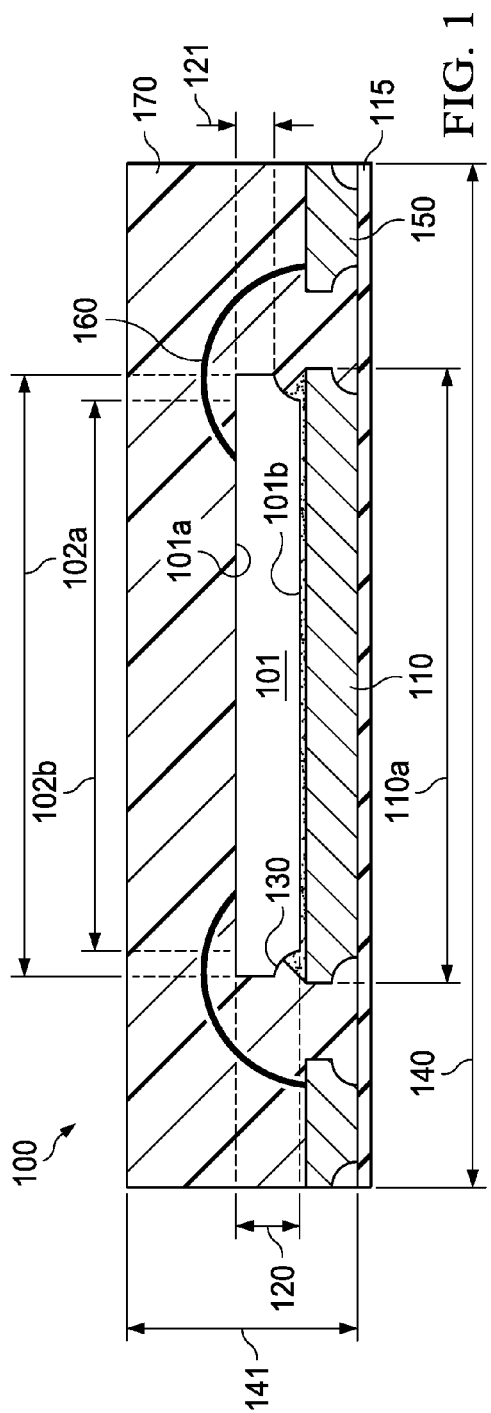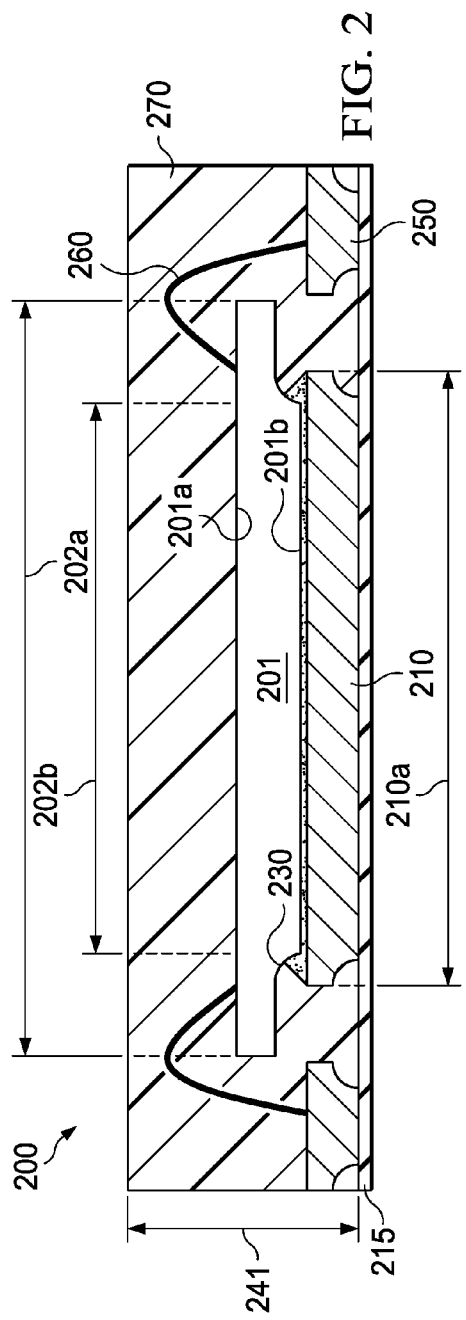

PACKAGED SEMICONDUCTOR DEVICE HAVING STACKED ATTACHED CHIPS OVERHANGING THE ASSEMBLY PAD

CROSS REFERENCE TO RELATED APPLICATIONS

This application is a Divisional of and claims benefit of U.S. patent application Ser. No. 14/580,836, filed Dec. 23, 2014. Said Application herein incorporated by reference in its entirety.

FIELD

Embodiments of the invention are related in general to the field of semiconductor devices and processes, and more specifically to the structure and fabrication method of packaged semiconductor devices with single or stacked chips overhanging the assembly pad.

DESCRIPTION OF RELATED ART

It is common practice in fabricating semiconductor devices that semiconductor chips are attached to substrate pads with an adhesive material such as a solder or a polymeric compound. In this attachment process, first a controlled amount of adhesive material is deposited on the pad, and then the chip is placed on top of the material while enough pressure is applied to distribute the material uniformly and allow a small amount of material to bulge from the chip edges. For the visual process quality control by inspectors, this bulge is indispensable as a signal of defect-free assembly.

As a consequence of this generally accepted quality control practice, chip areas have to be at least slightly smaller than assembly pad areas to allow enough space for the bulges of adhesive material. Whenever a new product requires a larger chip area than the preceding product, a new generation of assembly pads has to be provided with a pad area larger than the one required before. In order to satisfy this need, time and money have to be expended.

SUMMARY

Applicants realized that the ongoing market pressures for greater flexibility in satisfying customer needs and for faster product turn-around time need a quantum jump in assembling semiconductor chips on substrate pads. Applicant saw that until now a semiconductor chip has been considered an inseparable unit, wherein the active side and the passive side (which is to be attached) form an immutable hexahedron with straight sidewalls.

By considering the passive chip side independent from the active side, applicants solved the problem of requiring an enlarged assembly pad every time the chip size is increased, when they discovered a methodology of diminishing the area of the passive side for the attachment process while retaining the area of the active side for the circuitry.

In the methodology, the singulation of chips from a semiconductor wafer is performed in two steps. The inactive side of the wafer receives a grid of linear grooves of a first width and a depth smaller than the wafer thickness. Then, the active side of the wafer receives a matching grid of linear slits of a second width smaller than the first width and a depth merging the slits with the respective grooves, thereby singulating chips from the wafer.

As a result of the two-step singulation process, each chip has a large-area active side while exhibiting an overhang over the smaller-area passive side. As a hexahedron with concave curved sidewalls, the chip maintains the active side required by the circuitry while obtaining a passive area acceptable to the available assembly pad.

BRIEF DESCRIPTION OF THE DRAWINGS

FIG. 1 shows a cross section of a packaged semiconductor device having a chip attached to a substrate pad, wherein the active chip side is greater than the inactive chip side, forming an overhang, and at least as large as the pad.

FIG. 2 illustrates a cross section of another packaged semiconductor device having a chip attached to a substrate pad, wherein the active chip side is greater than the inactive chip side, forming an overhang, and greater than the pad, forming an overhang over the pad.

DETAILED DESCRIPTION OF THE PREFERRED EMBODIMENTS

Figure 3:
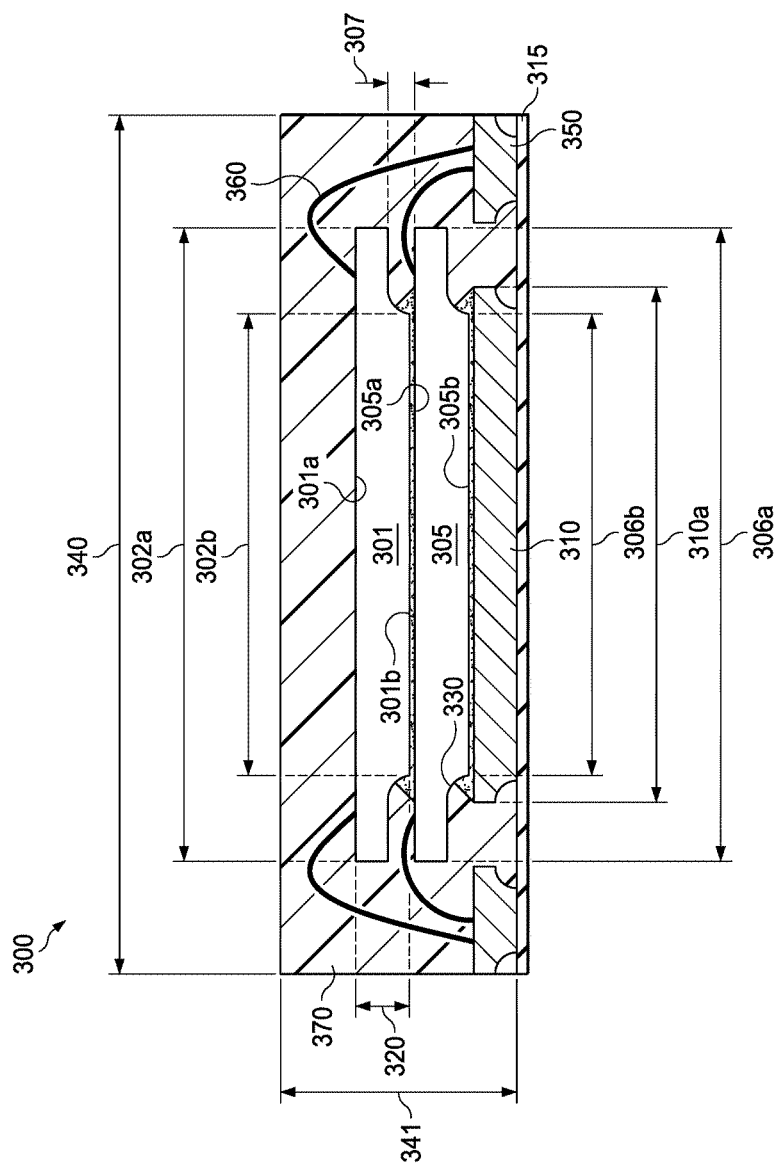
FIG. 3 depicts a cross section of yet another packaged semiconductor device having two chips vertically assembled and the stack attached to a substrate pad, wherein the active chip sides are greater than the inactive chip sides, forming overhangs, and also greater than the pad, forming also overhangs over the pad.

FIG. 1 illustrates an exemplary embodiment of the invention, a packaged semiconductor device generally designated 100. The device has an overall length of 4.0 mm and a thickness 141 of 0.6 mm. The device includes a semiconductor chip 101, which has an electrically active side 101a and an opposite electrically inactive side 101b (which may, however, include ground potential). As an example, the chip thickness 120 may be about 0.20 mm. More generally, active side 101a may be characterized as the patterned side, and inactive side 101b may be characterized as the un-patterned side. The semiconductor material may be silicon, silicon germanium, gallium arsenide, gallium nitride, or any other III-V or II-VI compound used for electronic devices. Both the active side and the inactive side of the chip have rectangular or square peripheries but are not of identical size; active side 101a has a larger circumference than inactive side 101b. Considering analogous parallel lengths, the smaller size of the inactive side relative to the active side is indicated in the cross section of FIG. 1 by the shorter length 102b compared to the greater length 102a of the active side. The active side 101a is bordered by an edge with a first length, which, for brevity, is also designated 102a. The inactive side 101b is bordered by a parallel edge having a second length 102b smaller than the first length.

In some devices, the inactive or un-patterned side may be smaller than the active or patterned side not along all four edges, but only along one, two, or three edges. In still other devices, the shorter lengths may not be parallel to the greater lengths, but form an angle relative to the greater lengths.

FIG. 1 indicates that the surface 130 of the transition from the larger active chip side to the smaller inactive chip side may be curved in a concave sense. In other devices, the chips may have a linear transition surface, or a surface which starts at the edge parallel to the active chip side and then gradually changes into a concave shape. In all cases, the chip material close to the active surface forms an overhang over the inactive chip side. In the example of FIG. 1, the overhanging semiconductor material may have a thickness 121 of about 0.17 mm; in other devices, thickness 121 is 0.10 mm.

In other embodiments, the semiconductor chip may have triangular sides or any other geometric configuration. In all cases, though, the electrically active side has a larger area than the electrically inactive or passive area, and the analogous side edges are greater for the active side than for the inactive side.

FIG. 1 indicates that chip 101 is attached to suitable site of a substrate. The substrate may be the chip pad 110 of a metal leadframe 115, as shown by the example of FIG. 1. Alternatively the site may be an attachment pad of a laminated substrate, or it may be the metalized pad of a board. In these and other examples, the substrate provides an assembly pad bordered by a linear edge having a third length. In FIG. 1, the third length is shown as length 110a; in this example, length 110a is 2.5 mm. As FIG. 1 shows, the third length is equal to parallel first length shown as 102a, allowing the chip to use the full lateral dimension of the pad. In other embodiments (see FIG. 2), the third length is smaller than the parallel first length.

As FIG. 1 indicates, the inactive chip side 101b is attached to the pad so that the chip edge of first length is parallel to the pad edge of third length. For many devices, a layer of a conductive adhesive polymer is preferred as attachment material; other devices use a solder layer. The layer preferably has a thickness of about 25 µm.

In the device example of FIG. 1, chip 101 is connected by bonding wires 160 to terminals of device 100, which are exemplified by leadframe leads 150. In laminated substrates, leads 150 are replaced by metallic terminal pads. Chip 101, bonding wires 160 and portions of pad 110 and leads 150 are encapsulated in a packaging compound 170, preferably an epoxy-based molding compound.

In contrast, FIG. 2 shows an exemplary embodiment 200, wherein a significant overhang is formed between the active chip side 201a and the attachment pad 210. The active chip side with the edge of first length, represented by 202a, is between about 3.05 mm and 3.55 mm, while third length 210a of the pad is 2.5 mm. The inactive chip side has an edge of second length 202b of about 2.25 mm allowing attachment to pad 210. As FIG. 2 illustrates, the overhang of the chip over the attachment pad may be formed by an undercut with a surface 230 configured to transit gently from the greater active chip side to the narrower inactive side; in the example of FIG. 2, a portion of linear surface approximately parallel to surface 201a morphs into a concave portion extending to surface 201b. The methods for forming these and other surface contours see below. In some devices, the overhang may be along one edge of the attached chip; in other devices, the overhang may be along more than one edges, for instance along all four edges.

Similar to exemplary device 100, FIG. 2 indicates that in device 200 the substrate for attaching chip 201 may be a metal leadframe 215 with pad 210 and leads 250 as terminals of packaged device 200. FIG. 1 indicates that chip 101 is attached to suitable site of a substrate. Alternatively, attachment site 210 may be a metalized pad of a laminated substrate, or it may be the metalized pad of a board. In these and other examples, the substrate provides an assembly pad bordered by a linear edge having a third length. As FIG. 2 shows, the third length is parallel to first length.

As FIG. 2 displays, the inactive chip side 102b is attached to the pad by an adhesive layer, which may be a conductive polymer or a solder layer. The layer preferably has a thickness of about 25 µm. In exemplary device 200, chip 201 is connected by bonding wires 260 to leads 250 as terminals of device 200. Chip 201, bonding wires 260 and portions of pad 210 and leads 250 are encapsulated in a packaging compound 270, preferably an epoxy-based molding compound. The device thickness 241 may, for instance, be 0.6 mm; other devices may be thicker or even thinner.

Another embodiment of the invention, generally designated 300, is illustrated in FIG. 3. Device 300 has a first semiconductor chip 301 with an electrically active side 301a and an opposite electrically inactive side 301b. The active side is bordered by an edge having a first length 302a, the inactive side is bordered by a parallel edge having a second length 302b smaller than the first length 302a. In the example of FIG. 3, the first length may be about 3.05 mm, and the second length may be about 2.25 mm. In other devices, the lengths may be greater or smaller. The active side forms an overhang over the inactive side, which may be shaped as a concave undercut. The thickness 320 of first chip 301 may be about 0.2 mm; greater or smaller thicknesses are being employed.

Device 300 further has a second semiconductor chip 305 with an electrically active side 305a and an opposite electrically inactive side 305b. The active side is bordered by an edge having a third length 306a, which may be equal to, smaller than, or greater than the first length 302a; in the example of FIG. 3, third length 306a is equal to first length 302a. The inactive side of second chip 305 is bordered by a parallel edge having a fourth length 306b smaller than the third length 306a.

As FIG. 3 shows, the inactive chip side 301b of the first chip 301 is attached to the active side 305a of the second chip 305. The attachment is performed so that the edge of the first length 302a is parallel to the edge of the third length 305a. For many devices, a layer of a conductive adhesive polymer is preferred as attachment material; other devices use a solder layer. The layer preferably has a thickness of about 25 µm. First chip 301 and second chip 305 form a stack of chips. As FIG. 3 illustrates, the distance 307, i.e. the separation between the chips, is the sum of the thicknesses of the attachment layer and the undercut of the first chip. Distance 307 may be about 0.10 mm high; at any rate, distance 307 has to be large enough to accommodate the wire arch resulting from the wire bonding operation.

The second chip 305 is attached to suitable site of a substrate. The substrate may be the chip pad 310 of a metal leadframe 315, as shown for the exemplary device 300. Alternatively, the site may be an attachment pad of a laminated substrate, or it may be the metalized pad of a board. In these and other examples, the substrate provides an assembly pad bordered by a linear edge having a fifth length. In FIG. 3, the fifth length is shown as length 310a; in this example, length 310a is 2.50 mm. For the exemplary device 300 in FIG. 3, the fifth length is smaller than parallel first length 301a and third length 306a, allowing the chip stack to use the space beyond the lateral dimension of pad 310. In other embodiments, the overhang of one or both chips may be longer and even extend over a portion of the leads 350. In yet other embodiments, fifth length 310a may be equal to third length 306a.

Embodiments include devices wherein the third length is equal to or smaller than the first length and the active side of the attached first chip forms an overhang over the active side of the second chip. Further, embodiments include devices wherein the fifth length is smaller than the third length and the active side of the attached second chip forms an overhang over the top pad side.

As FIG. 3 indicates, the inactive chip side 306b is attached to pad 310 so that the chip edge of third length 306a is parallel to the pad edge of fifth length 310a. Consequently, chips 301 and 305 are assembled as a stack on pad 310. For many devices, a layer of a conductive adhesive polymer is preferred as attachment material; other devices use a solder layer. The layer preferably has a thickness of about 25 μm.

In the device example of FIG. 3, chips 301 and 305 are connected by bonding wires 360 to terminals of device 300, which are exemplified by leadframe leads 350. In laminated substrates, leads 350 are replaced by metallic terminal pads. Chips 301 and 305, bonding wires 360 and portions of pad 310 and leads 350 are encapsulated in a packaging compound 370, preferably an epoxy-based molding compound. The height 341 of the packaged device 300 may be about 0.90 mm; however, devices may have a greater or smaller height. Length 340 of the packaged device 300 may be about 4.0 mm; however, devices may have a greater or smaller length.

Another embodiment of the invention is a method for fabricating a semiconductor chip with an overhang of the chip side containing the active elements over the opposite side free of active elements. The method starts by providing a semiconductor wafer of a first thickness, which has an electrically active side and an opposite electrically inactive side. The active side includes a plurality of sites, which will become chips, containing elements such as transistors, diodes, and integrated circuitry; the fabrication of the active elements is completed. The sites have linear borders between adjacent chips. As an example, the sites may have rectangular configuration with linear borders between the each adjacent site.

In the next process, the inactive wafer side is subjected to a backgrinding technique in order to reduce the first thickness of the wafer to a second thickness smaller than the first thickness.

Next, a grid of linear grooves is formed in the semiconductor material of the inactive wafer side. The grooves are arrayed in parallel rows intersecting with parallel columns so that the rows and columns are at right angles to each other. The technique to form the grooves is selected from a group including laser sawing, mechanical sawing with a relatively wide blade, chemical etching, and hitting with liquid jets. The grooves such generated have edges spaced by a first width and a depth smaller than the second thickness. Dependent on device type, first width may be between 0.2 mm and 1.0 mm or more. Preferably, the grooves have a rounded bottom; alternatively, the bottom may be more triangular or cornered.

In the next process, a matching grid of linear slits is formed on the active wafer side. The slits are arrayed in parallel rows intersecting with parallel columns. The preferred technique to form the slits is a mechanical saw with thin blade. The slits have edges spaced by a second width smaller than the first width and a depth deep enough so that the slits can merge with the respective grooves. Preferably, each slit is administered about in the middle of the respective groove penetrating the wafer from the opposite side. After the merger of slit and grooves, the merged slits and grooves represent effective cuts for singulating discrete rectangular chips from the wafer.

The resulting chips have overhangs of the active side over the inactive side. Each singulated chip has an electrically active side bordered by an edge having a first length, and an opposite electrically inactive side bordered by a parallel edge having a second length smaller than the first length.

Another embodiment of the invention is a method for fabricating a semiconductor device with a single chip with an overhang attached to a substrate. The method starts by providing a semiconductor chip with an electrically active side and an opposite electrically inactive side. The active side is bordered by an edge having a first length, the opposite inactive side is bordered by a parallel edge having a second length smaller than the first length. Consequently, the active side forms an overhang over the inactive side. For some exemplary chips, the second length may be 2.25 mm and the first length 3.55 mm, creating a relatively long overhang of 0.65 mm on each chip end.

Next, a substrate is provided, which has an assembly pad bordered by a linear edge having a third length equal to or smaller than the first length. A preferred substrate is a metal leadframe. Alternatively, the substrate may made by laminating metal and insulating layers into a multilayer composite. In addition to the assembly pad, the substrate has a plurality of leads, which serve a terminals of the completed device; the leads are in the proximity of the pad and may surround the pad.

In the next process, the inactive chip side is attached to the pad so that the edge of the first length is parallel to the edge of the third length. Thereafter, the chip is connected to respective substrate terminals by bonding wires. Then, the chip and the bonding wires are encapsulated in a packaging compound, for instance in an epoxy-based molding compound.

Another embodiment of the invention is a method for fabricating a semiconductor device having a set of vertically stacked chips with overhangs attached to a substrate. The method starts by providing a first semiconductor chip with an electrically active side and an opposite electrically inactive side. The active side is bordered by an edge with a first length, the inactive side is bordered by a parallel edge having a second length smaller than the first length. As a consequence, the active side forms an overhang over the inactive side. For some exemplary chips, the second length may be 2.25 mm and the first length 3.55 mm, creating a relatively long overhang of 0.65 mm on each chip end.

Next, a second semiconductor chip is provided, which has an electrically active side and an opposite electrically inactive side, the active side bordered by an edge having a third length equal to, smaller, or greater than the first length, the inactive side bordered by a parallel edge having a fourth length smaller than the third length.

In the next process, the inactive chip side of the first chip is attached to the active side of the second chip so that the edge of the first length is parallel to the edge of the third length. Consequently, the first chip is vertically stacked on the second chip, forming a vertical chip set. For devices wherein the third length is equal to or smaller than the first length, the active side of the attached first chip forms an overhang over the active side of the second chip. After the stack set has been assembled, there has to be enough space between the overhang of the first chip and the active side of the second chip to span bonding wires from the second chip to substrate leads without contact between the wires and the underside surface of the overhang.

Next, a substrate is provided, which has an assembly pad bordered by a linear edge with a fifth length equal to or smaller than the third length. The substrate may be a metal leadframe or a laminated board. The substrate includes a plurality of leads or terminals in the proximity of the assembly pad. The inactive chip side of the second chip is attached to the pad so that the edge of the third length is parallel to the edge of the fifth length. For devices wherein the fifth length is smaller than the third length, the active side of the attached second chip forms an overhang over the pad. As mentioned, the adhesive layer is preferably formed by a conductive polymer, but may also be formed by solder; in both cases, the preferred thickness of the adhesive layer is about 0.025 mm.

In the next process, the first chip and the second chip are connected to respective substrate terminals by bonding wires. Thereafter, the chips and the bonding wires are encapsulated in a packaging compound, preferably by an epoxy-based molding compound.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

For products with more than one chip, the invention applies to two, three or more chips. The invention applies to products with chips of equal thickness and to products, wherein the chips have different thicknesses. The invention applies to products with chips of equal overhangs, and to products, wherein the chips have different overhangs.

As another example, the invention applies to any semiconductor device family which uses QFN/SON leadframes, or a leadframe with pins. The invention further applies to any amount of overhang over to the attachment pads/

It is therefore intended that the appended claims encompass any such modifications or embodiment.

We claim:

1. A semiconductor device comprising:
   a first semiconductor chip having an electrically active side and an opposite electrically inactive side, the active side of the first chip having a first length, the inactive side of the first chip having a second length smaller than the first length;
   a second semiconductor chip having an electrically active side and an opposite electrically inactive side, the active side of the second chip having a third length equal to or smaller than the first length, the inactive side of the second chip having a fourth length smaller than the third length, the inactive side of the first chip attached to the active side of the second chip;
   an assembly pad including a first side with a fifth length smaller than the third length and larger than the fourth length; and
   a plurality of terminals electrically connected to active sides of the first and second chips.

2. The device of claim 1, wherein the assembly pad further includes an opposite second side having a sixth length smaller than the fifth length, and wherein the inactive side of the second chip is attached to the first side of the assembly pad.

3. The device of claim 2, wherein:
   the first side and the second side of the assembly pad are connected by a plurality of concave sidewalls; and
   the active side and the inactive side of the first and second chips are connected by a plurality of concave sidewalls.

4. The device of claim 1, wherein the first chip forms an overhang over the second chip.

5. The device of claim 1, wherein the plurality of terminals are electrically connected to active sides of the first and second chips via a plurality of bonding wires.

6. The device of claim 5 further including a packaging compound encapsulating the first and second chips, the plurality of bonding wires, and at least portions of the assembly pad and the plurality of terminals.

7. The device of claim 1, wherein the device has a length of about 4.0 mm and a thickness of about 0.6 mm.

8. The device of claim 1, wherein each of the first chip and the second chip has a thickness of about 0.20 mm.

* * * * *